United States Patent
Barnes et al.

(10) Patent No.: US 8,296,688 B2
(45) Date of Patent: Oct. 23, 2012

(54) EVALUATING THE QUALITY OF AN ASSIST FEATURE PLACEMENT BASED ON A FOCUS-SENSITIVE COST-COVARIANCE FIELD

(75) Inventors: Levi D. Barnes, Hillsboro, OR (US); Benjamin D. Painter, Portland, OR (US); Qiliang Yan, Portland, OR (US); Yongfa Fan, San Jose, CA (US); Jianliang Li, Hillsboro, OR (US); Amyn Poonawala, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/094,749

(22) Filed: Apr. 26, 2011

(65) Prior Publication Data
US 2011/0202891 A1    Aug. 18, 2011

Related U.S. Application Data

(62) Division of application No. 12/263,354, filed on Oct. 31, 2008, now Pat. No. 7,954,071.

(51) Int. Cl.
*G06F 17/50* (2006.01)
(52) U.S. Cl. .................. 716/53; 716/51; 716/119; 430/5
(58) Field of Classification Search ............... 716/51, 716/53, 119; 430/5
See application file for complete search history.

(56) References Cited

U.S. PATENT DOCUMENTS

| | | | |
|---|---|---|---|
| 4,471,448 A | 9/1984 | Williams | |
| 6,526,164 B1 | 2/2003 | Mansfield | |
| 6,871,337 B2 | 3/2005 | Socha | |
| 7,016,017 B2 * | 3/2006 | Hansen | 355/67 |
| 7,057,709 B2 | 6/2006 | Rosenbluth | |
| 7,079,223 B2 | 7/2006 | Rosenbluth | |
| 7,231,629 B2 | 6/2007 | Laidig | |
| 7,421,678 B2 * | 9/2008 | Barnes et al. | 716/50 |
| 7,499,576 B2 | 3/2009 | Setala | |
| 7,506,299 B2 | 3/2009 | Socha | |
| 7,571,417 B2 * | 8/2009 | Izuha et al. | 716/53 |
| 7,739,651 B2 * | 6/2010 | Melvin et al. | 716/50 |
| 7,849,423 B1 | 12/2010 | Yenikaya | |

(Continued)

OTHER PUBLICATIONS

Lawrence et al.; "Assist Feature Placement Analysis Using Focus Sensitivity Models"; 22nd European Mask and Lithography Conference; Proc. of SPIE vol. 6281, 2006; pp. 1-7.*

*Primary Examiner* — Naum Levin
(74) *Attorney, Agent, or Firm* — Park, Vaughan, Fleming & Dowler LLP; Laxman Sahasrabuddhe

(57) ABSTRACT

One embodiment of the present invention provides a system that determines an assist feature placement within a post-optical proximity correction (post-OPC) mask layout. During operation, the system receives a set of target patterns which represent a set of polygons in a pre-OPC mask layout. The system then constructs a focus-sensitive cost function based on the target patterns, wherein the focus-sensitive cost function represents an amount of movement of post-OPC contours of the target patterns in response to changes in focus condition of the lithography system. Next, the system computes a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout. Finally, the system generates assist features for the post-OPC mask layout based on the CCF field.

19 Claims, 6 Drawing Sheets

U.S. PATENT DOCUMENTS

| | | | |
|---|---|---|---|
| 7,877,723 B2 * | 1/2011 | Park | 716/50 |
| 7,954,071 B2 * | 5/2011 | Barnes et al. | 716/53 |
| 2004/0247171 A1 * | 12/2004 | Hashimoto et al. | 382/141 |
| 2005/0015233 A1 | 1/2005 | Gordon | |
| 2005/0076321 A1 | 4/2005 | Smith | |
| 2005/0153217 A1 * | 7/2005 | Izuha et al. | 430/5 |
| 2005/0185159 A1 | 8/2005 | Rosenbluth | |
| 2005/0278686 A1 | 12/2005 | Word | |
| 2006/0190850 A1 | 8/2006 | Kohle | |
| 2006/0248495 A1 | 11/2006 | Sezginer | |
| 2007/0038973 A1 * | 2/2007 | Li et al. | 716/21 |
| 2007/0094634 A1 * | 4/2007 | Seizginer et al. | 716/21 |
| 2007/0250804 A1 * | 10/2007 | Melvin et al. | 716/19 |
| 2008/0008972 A1 * | 1/2008 | Muelders et al. | 430/346 |
| 2008/0138719 A1 | 6/2008 | Park | |
| 2008/0301620 A1 | 12/2008 | Ye | |
| 2009/0004576 A1 | 1/2009 | Furukawa | |
| 2009/0015360 A1 | 1/2009 | North | |
| 2009/0217218 A1 | 8/2009 | Adam | |
| 2010/0262946 A1 | 10/2010 | Poonawala | |

* cited by examiner

EVALUATING THE QUALITY OF AN ASSIST FEATURE PLACEMENT BASED ON A FOCUS-SENSITIVE COST-COVARIANCE FIELD

RELATED APPLICATIONS

This application is a divisional application of, and claims priority under 35 U.S.C. §121 to, U.S. Pat. No. 7,954,071, application Ser. No. 12/263,354, entitled "Assist Feature Placement Based on a Focus-Sensitive Cost-Covariance Field," by inventors Levi D. Barnes, Benjamin D. Painter, Qiliang Yan, Yongfa Fan, Jianliang Li, and Amyn Poonawala, issued on 31 May 2011, filed on 31 Oct. 2008.

BACKGROUND

1. Field of the Invention

Embodiments of the present invention generally relate to techniques for designing and manufacturing integrated circuits (ICs). More specifically, embodiments of the present invention relate to evaluating the quality of an assist feature placement in a mask layout based on a focus-sensitive cost-covariance field.

2. Related Art

The dramatic improvements in semiconductor integration densities in recent years have largely been made possible by corresponding improvements in semiconductor manufacturing technologies.

One such manufacturing technology involves placing assist features in a mask layout to improve the depth of focus of the patterns on the mask layout which are intended to be printed on the wafer. Such assist features can be printing assist features (e.g., super-resolution assist features) or non-printing assist features (e.g., sub-resolution assist features).

Existing techniques for placing assist features typically use mask rules, which place and clean up assist features based on combinations of feature width and spacing parameters. Unfortunately, such rule-based approaches can result in missed or sub-optimal placement and/or clean up of assist features. Furthermore, the complexity of such rules increases rapidly with shrinking feature size, thereby requiring increasing effort on the part of designers. Moreover, these rules can be overly restrictive, which can prevent designers from achieving optimal semiconductor device performance.

In contrast to the rule-based approaches, model-based assist feature (AF) placement techniques have the advantages of facilitating faster adaptation to new manufacturing processes, achieving "smoother" AF placement, and reducing the need for aggressive and complicated clean-up and placement rules.

For example, one model-based AF placement technique has been successfully used to generate assist features for contact hole layers based on an optical model. However, because this placement technique for the contact hole layers is based on maximizing intensity at the center of contacts, the technique often produces incorrect AF placement solutions when it is applied to line-space layers.

Another model-based AF placement technique uses the inverse lithography technique (ILT) to produce assist features. Such assist features are typically generated by constructing cost functions that maximize image log slope (ILS) at pattern edges. Unfortunately, ILT-based AF placement techniques not only require many iterations to converge on a solution but often produce poor AF placement results.

Hence, what is needed is a method and apparatus for determining an AF placement to improve the depth of focus for a layout without the above-described problems.

SUMMARY

One embodiment of the present invention provides a system that determines an assist feature placement within a post-optical proximity correction (post-OPC) mask layout. During operation, the system receives a set of target patterns which represent a set of polygons in a pre-OPC mask layout. The system then constructs a focus-sensitive cost function based on the target patterns, wherein the focus-sensitive cost function represents an amount of movement of post-OPC contours of the target patterns in response to changes in focus condition of the lithography system. Note that the contours of the target patterns substantially coincide with the edges of set of the polygons. Next, the system computes a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout. Finally, the system generates assist features for the post-OPC mask layout based on the CCF field.

In a variation on this embodiment, the system constructs the focus-sensitive cost function based on the contour map by first defining a contour movement metric $$\frac{\partial I/\partial F}{\nabla I \cdot \hat{n}},$$

wherein $\partial I/\partial F$ represents change in intensity I on the contour map with respect to change in focus F, $\nabla I$ is the gradient of the intensity I, and $\hat{n}$ is a normalized vector perpendicular to the edges of the set of target patterns. The system then constructs the focus-sensitive cost function $$C = \oint_{edges} \frac{\partial I/\partial F}{\nabla I \cdot \hat{n}}$$

by integrating the contour movement metric over the edges of the set of target patterns.

In a further variation, the system computes the CCF field based on the focus-sensitive cost function by first differentiating the focus-sensitive cost function with respect to a change made within the post-OPC mask layout to obtain an expression $$\delta C = \oint_{edges} \frac{\delta(\partial I/\partial F)}{\nabla I \cdot \hat{n}} - \frac{\partial I/\partial F}{(\nabla I \cdot \hat{n})^2} \delta \nabla I.$$

Next, for each change made at a location P within the mask layout, the system evaluates $\delta C$ using the expression, wherein location P is a candidate location for placing an assist feature. The system then forms the CCF field based on the $\delta C$ values computed at all candidate locations for placing assist features.

In a further variation, the system computes $\delta C$ for each location P by approximating $I(P_0)$ using an expression $$I(P_0) = \sum_k \left| \int M(P) U_k(P_0 - P) d^2 P \right|^2$$

to compute the intensity I, wherein $U_k$ is a set of 2D kernels in the sum of coherent systems (SOCS) approximation, M is a 2D function that represents the pre-OPC mask layout, and $P_0$ is an evaluation point within the mask layout.

In a further variation, the system computes the effect of adding a small pattern $\delta M$ at location P within the post-OPC mask layout on intensity $I(P_0)$ at evaluation point $P_0$ using an expression:

$$\delta I(P_0) = \sum_k \left( \int M(P) U_k(P_0 - P) d^2 P \right) \left( \int \delta M(P) U_k(P_0 - P) d^2 P \right) +$$
$$\sum_k \left( \int \delta M(P) U_k(P_0 - P) d^2 P \right) \left( \int \delta M(P) U_k(P_0 - P) d^2 P \right) + c.c.,$$

wherein the first term represents the interference of $\delta M$ with the post-OPC mask layout, the second term represents the interaction between $\delta M$ and another small pattern placed at a different location, and location P is at a distance away from the evaluation point $P_0$.

In a further variation, the system approximates the post-OPC mask layout with the pre-OPC mask layout.

In a further variation, the system neglects the second term in the expression for $\delta I(P_0)$, so that $$\delta I(P_0) \cong \sum_k \left( \int M(P) U_k(P_0 - P) d^2 P \right) \left( \int \delta M(P) U_k(P_0 - P) d^2 P \right) + c.c.$$

In a further variation, the system computes the effects of multiple small patterns $\delta M_i$ at different locations in the post-OPC mask layout M on intensity $I(P_0)$ by computing a linear superposition of the effects from each of the small patterns $\delta M_i$, wherein each of the small patterns $\delta M_i$ can be approximated with a delta function center at location $P_i$.

In a further variation, the system approximates $\delta(\partial I/\partial F)$ in the expression for $\delta C$ with a finite difference between two optical focus conditions of the lithography system such that $\delta(\partial I/\partial F) \cong (\delta I_{+d} - \delta I_0)/d$, wherein $I_0$ is the intensity associated with an on-focus condition, and $I_{+d}$ is the intensity associated with an off-focus distance d.

In a variation on this embodiment, the system generates the assist features for the post-OPC mask layout based on the CCF field by placing positive assist features at locations in the post-OPC mask layout wherein the computed CCF field has negative values. Note that the negative values indicate that the amount of movement of the set of contours is reduced by placing the positive assist features at these locations.

In a variation on this embodiment, the system generates the assist features for the post-OPC mask layout based on the CCF field by placing negative assist features at locations in the post-OPC mask layout, wherein the computed CCF field has positive values. Note that the positive values indicate that the amount of movement of the set of contours is increased by placing the positive assist features at these locations, and negative assist features correspond to holes in the target patterns.

One embodiment of the present invention provides a system that evaluates the quality of an assist feature placement within a post-optical proximity correction (post-OPC) mask layout. During operation, the system receives a set of target patterns which represent a set of polygons in a pre-OPC mask layout. The system additionally receives an assist feature placement for the post-OPC mask layout. The system then constructs a focus-sensitive cost function based on the target patterns, wherein the focus-sensitive cost function represents an amount of movement of post-OPC contours of the target patterns in response to changes in focus condition of the lithography system. Note that the contours of the target patterns substantially coincide with the edges of set of the polygons. Next, the system computes a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout. Finally, the system uses the CCF field to evaluate the quality of the assist feature placement for the post-OPC mask layout.

In a variation on this embodiment, the system evaluates the quality of the assist feature placement for the mask layout by: multiplying the CCF field with a placement map for the assist feature placement to obtain a weighted CCF field, wherein the placement map equals one at locations of positive assist features, minus one at locations of negative assist features, and zero at locations where there is no assist feature; integrating the weighted CCF field to obtain a quality indicator; and evaluating the quality of the assist feature placement based on the quality indicator.

In a further variation, the system evaluates the quality of the assist feature placement based on the quality indicator by: comparing a first quality indicator associated with a first assist feature placement with a second quality indicator associated with a second assist feature placement; and identifying a better assist feature placement associated with a smaller of the first and second quality indicators.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Integrated Circuit Design Flow

Figure 1:
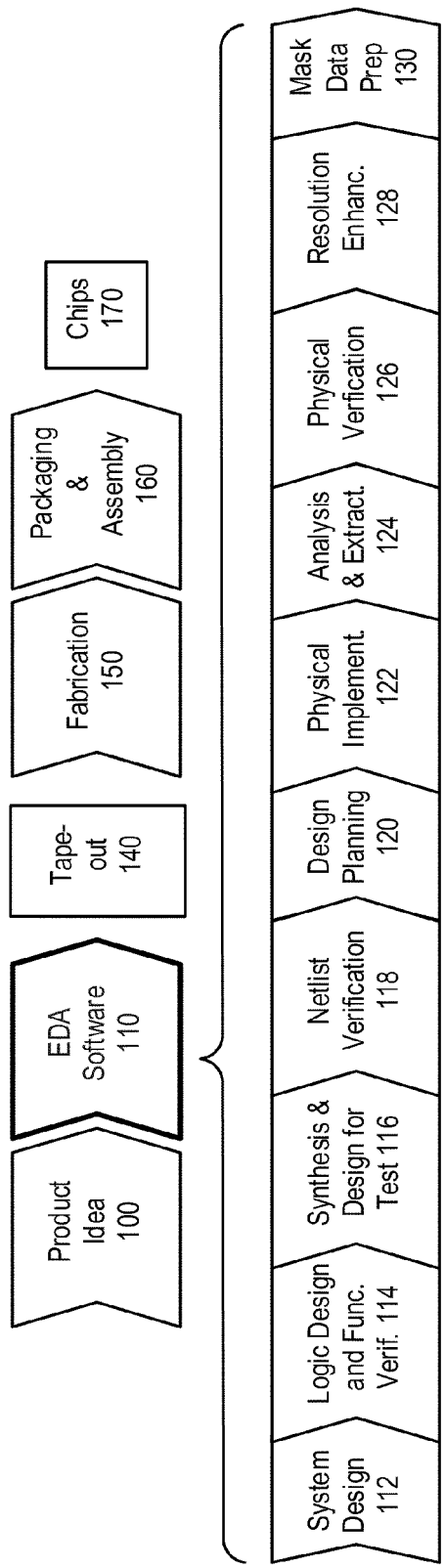
FIG. 1 illustrates various stages in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPLIER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, and STAR RC/XT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement step 128.

Assist Features

Sub-resolution assist features ("SRAFs" hereafter) are an effective way to improve through-process robustness (or depth of focus) of lithographic mask patterns by increasing the use of spatial frequency components that are largely insensitive to variations in focus condition to form desired features. The resulting increases in process margin can increase wafer yield and help to stretch existing technology to smaller process nodes. (Although embodiments of the present invention are described in the context of SRAFs, they can be used with other kinds of assist features, or alternatively with shifters in alternating phase shift masks. In the remainder of the instant application, unless otherwise noted, the term "assist feature" refers to an SRAF.)

Embodiments of the present invention can be used during each of five steps in the assist feature placement process, namely: (1) generation of placement rules, (2) initial SRAF placement, (3) resolution of MRC (Mask Rule Check) and other violations, (4) post-placement adjustment of assist features and (5) verification of assist feature effectiveness.

Creating a Cost Function

One of the objectives of AF placement within a mask layout is to reduce the change in the target patterns (i.e., the image of the mask layout when printed on a wafer) as the focus condition of the lithography system changes. Note that the focus condition change can arise due to a variety of reasons. For example, during photolithography, variations in the rotational speed of the spindle can cause the resist thickness to vary across the wafer, which in turn, can cause focus condition changes at different locations on the wafer. In one embodiment of the present invention, a cost function can be built to represent this objective, and eventually used to guide AF placement.

In the discussion hereafter, the term "target patterns" is referred to the set of target polygons in a pre-optical proximity correction (pre-OPC) layout. The term "contour" is used to refer to the boundary of a target pattern. Furthermore, the term "mask layout" is used to refer to a post-optical proximity correction (post-OPC) (i.e., an OPC-corrected) layout, unless the context clearly dictates otherwise. Consequently, it is also assumed that the contours produce by the lithography process using the post-OPC mask layout substantially coincide with the edges of the target patterns.

Note that the contour of a target pattern can also be defined as the set of points P at which intensity I(P) is equal to a specified threshold, such that above this threshold, the target pattern will print, and below this threshold, the target pattern will not print. Note that the two definitions for the term contour are essentially equivalent. Because change in focus conditions typically cause changes in the intensity profile of a target pattern, the contour position of the target pattern will change as a result of the changing in focus conditions. In the discussion below, we also refer to this change of contour position due to change of focus conditions as "contour movement."

To quantitatively describe contour movement, one embodiment of the present invention defines a contour movement metric $$\frac{\partial I / \partial F}{\nabla I \cdot \hat{n}}(P)$$

at each evaluation point P on the contour, wherein $\partial I/\partial F$ represents the change in intensity I(P) at point P with respect to the change in focus distance F, $\nabla I(P)$ is the gradient of the intensity I(P) at point P, and $\hat{n}(P)$ is a normalized vector perpendicular to the contour at point P.

Figure 2:
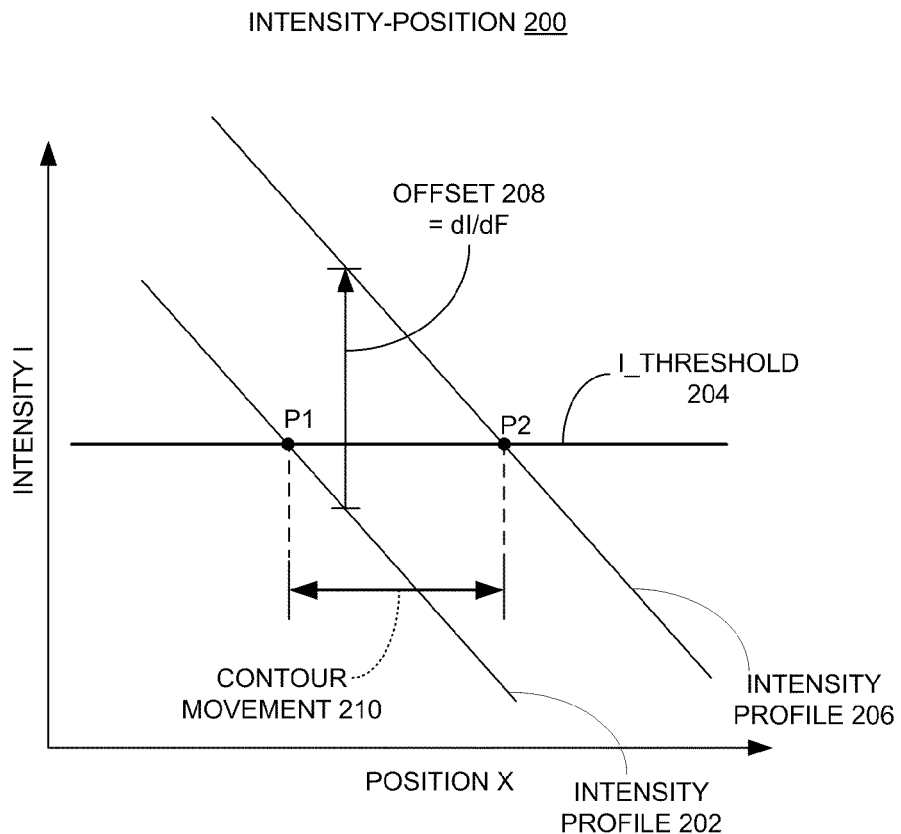
FIG. 2 illustrates a one-dimensional (1D) intensity-position plot which facilitates understanding the contour movement metric in accordance with an embodiment of the present invention.

FIG. 2 illustrates a one-dimensional (1D) intensity-position plot 200 which facilitates understanding the contour movement metric in accordance with an embodiment of the present invention.

Specifically, intensity-position plot 200 includes an intensity profile 202 representing the intensity of a target pattern along the x-direction (which can be an arbitrary direction in the two-dimensional (2D) space) under an on-focus condition. Note that intensity profile 202 is shown as a linear curve for the convenience of illustration. However, in general, the intensity profile can have any shape with respect to the position x.

Note that intensity profile 202 intercepts a horizontal line I_thresh 204, which represents the above-described threshold that defines the contour. Hence, the point of interception $P_1$ corresponds to a point on the contour for the target pattern.

Note that a new focus condition causes a change to the intensity profile 202. In one embodiment of the present invention, we treat this change in intensity due to change of focus condition as a constant offset from the original intensity profile 202. Hence, intensity profile 206 represents the intensity along the x-direction under a defocus condition which is offset from intensity profile 202 by an amount offset 208. Also note that this constant offset is a measure of the rate of intensity changes with respect to the focus change. Therefore, offset 208 from intensity profile 202 to intensity profile 206 is proportional to $\partial I/\partial F$ (using the expression of partial derivative because intensity is a function of multiple variables).

Consequently, the offset due to the focus condition change creates a change in the contour position from P1 to P2, which corresponds to a contour movement 210.

From FIG. 2, we can make the observation that contour movement 210 is proportional to the constant offset 208 and therefore to $\partial I/\partial F$. The second observation from FIG. 2 indicates that the slope $\partial I/\partial x$ of intensity profile 202 is also related to contour movement 210. More specifically, to achieve the same constant offset 208, a larger intensity slope $\partial I/\partial x$ of intensity profile 202 results in a smaller contour movement 210, which suggests an inverse proportional relationship. More generally, this intensity slope is measured in the vicinity of the evaluation point. Consequently, we can establish the following relationship:

contour movement $\propto (\partial I/\partial F)/(\partial I/\partial x)$.

To extend the above expression to the two-dimensional (2D) mask layout, we replace $\partial I/\partial x$ with the gradient of the intensity profile in the direction normal to the contour to get:

$$\text{contour movement} \propto \frac{\partial I / \partial F}{\nabla I \cdot \hat{n}}(P), \qquad \text{Eqn. (1)}$$

which is the above-proposed contour movement metric. Hence, to reduce the amount of contour movement at evaluation point P due to change of the focus conditions, it is preferable to decrease the value of $\partial I/\partial F$ and increase the value of intensity gradient $\nabla I \cdot \hat{n}$.

Based on the above contour movement metric, we can construct a cost function for a given mask layout comprising a set of polygons. In one embodiment, we can approximate each isolated polygon in the mask layout using a corresponding target pattern. Hence, the mask layout is approximated by a set of target patterns, wherein each target pattern further comprises a set of edges representing the corresponding polygon edges. To obtain the cost function C, we integrate the contour movement metric over the set of target patterns for the mask layout. Hence, we get:

$$C = \oint_{edges} \frac{\partial I / \partial F}{\nabla I \cdot \hat{n}}, \qquad \text{Eqn. (2)}$$

wherein the integral is taken over all "polygon edges" of the target patterns. In some embodiments, however, we can add a weighting factor to different edges such that the more important edges (i.e. gates, smaller features, etc.) are augmented with higher weights. Note that Eqn. (2) can be considered as a first order approximation of the expected contour movement due to the focus condition change.

Constructing a Cost-Covariance Field

Recall that one of the objectives of AF placement is to reduce the amount of contour movement, which may be represented by the cost function C. In one embodiment of the present invention, the cost function can be used to determine AF placements to achieve the above objective. Note that assist features change the mask layout, and a change to the mask layout enters the cost function through its effect on intensity I(P) on the contour. Consequently, the effect of a small change in the mask layout can be computed by differentiating the cost function C with respect to changes in the mask.

By differentiating the cost function using the chain-rule, we get:

$$\delta C = \oint_{edges} \frac{\delta(\partial I/\partial F)}{\nabla I \cdot \hat{n}} - \frac{\partial I/\partial F}{(\nabla I \cdot \hat{n})^2} \delta \nabla I. \quad \text{Eqn. (3)}$$

To consider the effect of adding assist features, we can take each of the differentials $\partial(\partial I/\partial F)$ and $\partial \nabla I$ as being with respect to changes in the mask layout.

We first consider the expression $\delta(\partial I/\partial F)$. In one embodiment, we can approximate $\partial I/\partial F$ by a finite difference between two optical systems off focus from each other by a small distance d, so we rewrite $\delta(\partial I/\partial F)$ as:

$$\alpha(\partial I/\partial F) \cong (\delta I_{+d} - \delta I_0)/d, \quad \text{Eqn. (4)}$$

wherein $I_0$ is the intensity associated with an on-focus condition, and $I_{+d}$ is the intensity associated with a defocus distance d. Alternatively, one can take the difference between the intensities using two opposite defocus conditions of ±d. However, attempting to minimize this difference is typically less useful because intensity tends to change symmetrically about the zero defocus condition (i.e., d=0).

Now, we examine each of the $\delta I$ terms in Eqn. (4). Note that both of the $\delta I$ terms represent a change in intensity value with respect to a small change in the mask layout. In one embodiment of the present invention, the light intensity of the mask image at the image plane (e.g., on the wafer plane) can be approximated by:

$$I(P_0) = \sum_k \left| \int M(P) U_k (P_0 - P) d^2 P \right|^2, \quad \text{Eqn. (5)}$$

wherein $U_k$ is a set of 2D kernels in the sum of coherent systems (SOCS) approximation that represent the lithograph process, M(P) is a 2D function that represents the mask layout, and $P_0$ is an evaluation point within the mask layout.

Next, we compute the effect of adding a small change $\delta M$ at a point P in the mask layout M on the intensity $I(P_0)$ at evaluation point $P_0$. We do so by differentiating Eqn. (5) to get the expression for $\delta I(P_0)$ as follows:

$$\delta I(P_0) = \quad \text{Eqn. (6)}$$
$$\sum_k \left( \int \delta M(P) U_k (P_0 - P) d^2 P \right) \left( \int \delta M(P) U_k (P_0 - P) d^2 P \right) +$$
$$c.c. + \sum_k \left( \int M(P) U_k (P_0 - P) d^2 P \right) \left( \int \delta M(P) U_k (P_0 - P) d^2 P \right),$$

wherein small change $\delta M$ in the mask layout is placed at a distance away from the evaluation point $P_0$. More specifically, the first term in Eqn. (6) represents the interference of $\delta M$ with the mask layout and symbol c.c. represents the complex conjugate of the first term. Moreover, the second term represents the effect of the interaction between two added small changes on the original mask at evaluation point $P_0$. Consequently, the second term represents a second order effect due to the changes to the mask.

Note that when assist features are placed in the mask layout, the dominant features of $\delta M$ are typically located at some distance away from the evaluation point $P_0$. Because each of the kernels $U_k$ has peak value around $P_0$, the second term contributes only a very small amount to the overall effect of $\delta M$ and therefore can be neglected. Hence, Eqn (6) can be simplified as follows:

$$\delta I(P_0) \cong \quad \text{Eqn. (7)}$$
$$\sum_k \left( \int M(P) U_k (P_0 - P) d^2 P \right) \left( \int \delta M(P) U_k (P_0 - P) d^2 P \right) + c.c.$$

Note that by neglecting the second term in Eqn. (6), the above expression for $\delta I$ now has a linear dependence on the small change $\delta M$. In other words, the effect of adding a first small change $\delta M_1$ is independent of adding a second small change $\delta M_2$. The importance of this approximation is that we can now add (or subtract) mask pattern $\delta M_i$ at each location in the 2D space individually, and compute the effect from each of the small changes $\delta M_i$ through a linear superposition of the individual effect according to Eqn. (7). In one embodiment, the placement of a small change $\delta M(P)$ can be described by using a delta function centered at location P'. By replacing $\delta M(P)$ with a delta function $\delta(P-P')$, Eqn. (7) can be rewritten as:

$$\delta I(P_0) \cong \sum_k \left( \int M(P) U_k (P_0 - P) d^2 P \right) U_k (P_0 - P') + c.c. \quad \text{Eqn. (8)}$$

We now consider how to apply the integration in Eqn. (3) to the expression for $\delta I$ in Eqn. (8). In one embodiment of the present invention, to perform the integration over all the edges of the target patterns, we create a weighting field (or "weight function") W overlapping the area of the target patterns representing the mask layout, wherein the weighting field equals one at the edges of the target patterns and zero everywhere else. In another embodiment of the present invention, instead of assigning an equal weight for all the edges, those edges of more importance features and structures in the mask layout (i.e., gates, features at minimum CD, etc.) are given higher weight values than other edges. We describe this embodiment in more detail below.

Using the weighting field W, the integration over $\delta I$ of Eqn. (8) becomes:

$$\int \delta I(P_0) W(P_0) d^2 P_0 = \sum_k ((M \otimes U_k) \cdot W) \otimes In[U_k] + c.c., \quad \text{Eqn. (9)}$$

wherein $\otimes$ represents a convolution operation, and In is an inversion operator such that $In[F](x)=F(-x)$. Note that using the inversion operator is necessary because it puts a correct order of the subtraction $(P_0-P')$ in the argument to $U_k$ for the above convolution expression.

Note that typically in mask synthesis applications, the kernels $U_k$ are eigenfunctions of the transmission cross-correlation (Tcc) operator. Because this operator is generally derived from the pupil and the source of the lithography system (which both are typically symmetric under inversion between $-P$ and P), the operator itself is typically symmetric under inversion, and each of the kernels $U_k$ will be either symmetric or anti-symmetric under inversion. Consequently, we can replace the inversion operator In with a multiplication by 1 or −1 depending on the symmetry of a given kernel. Let $P_k$ be 1 when $U_k$ is symmetric under inversion and −1 when $U_k$ is anti-symmetric. The expression for the weighted, integrated change in intensity becomes:

$$\int \delta I(P_0) W(P_0) d^2 P_0 = \sum_k P_k((M \otimes U_k) \cdot W) \otimes U_k + c.c. \quad \text{Eqn. (10)}$$

Note that Eqn. (10) can be used to compute a field which represents the effect of adding a pattern at each point P' toward changing the value of: $\int I(P_0)W(P_0)d^2P_0$, wherein the integration is taken over the entire mask layout.

We can rewrite Eqn. (3), i.e., the differentiation of the cost function C with respect to mask change, as follows:

$$\delta C = \oint_{edges} \frac{\delta(\partial I/\partial F)}{\nabla I \cdot \hat{n}} - \frac{\partial I/\partial F}{(\nabla I \cdot \hat{n})^2} \delta \nabla I$$

$$= \frac{1}{\nabla I \cdot \hat{n}} \left[ \delta I_{+d}(P_0) - \delta I_0(P_0) - \frac{\partial I/\partial F}{\nabla I \cdot \hat{n}} \delta \nabla I \right].$$

Note that both $\delta I_{+d}$ and $\delta I_0$ can be computed by using Eqn. (10). To provide an approximation to the gradient term $\delta \nabla I$, we can use two additional weighting functions. Recall that the above-described weighting function W was used to put all the emphasis on the edges of the target patterns. In one embodiment, to approximate the gradient term, we use weighting functions which put the emphasis just outside and just inside the edges. Consequently, the difference between $\delta I_0$ evaluated based on these two weighting functions provides an approximation to $\delta \nabla I$.

More specifically, if we multiply the full $\delta C$ expression by a weighting function for the edges, and follow the above-described procedure which converts the integrations into convolutions, we get the following expression:

$$\sum_k P_k((M \otimes U_k^{+d}) \cdot W) \otimes U_k^{+d} - \sum_k P_k((M \otimes U_k^0) \cdot W) \otimes U_k^0 +$$

$$\sum_k P_k\left((M \otimes U_k^0) \cdot W_{ext} \frac{\partial I/\partial F}{\nabla I \cdot \hat{n}}\right) \otimes U_k^0 -$$

$$\sum_k P_k\left((M \otimes U_k^0) \cdot W_{int} \frac{\partial I/\partial F}{\nabla I \cdot \hat{n}}\right) \otimes U_k^0 + c.c.$$

wherein the superscripts on $U_k$ indicate the focus conditions of the model and $W_{ext}$ and $W_{int}$ are the weight functions just outside and just inside the edges, respectively. In a further approximation, we replace $$\frac{\partial I/\partial F}{\nabla I \cdot \hat{n}}$$

with a constant value. Because the objective of constructing this field is to achieve through-focus stability of features of critical size, and isolated features typically exhibit the worst through-focus stability, we can evaluate $$\frac{\partial I/\partial F}{\nabla I \cdot \hat{n}}$$

at the edge of an isolated line feature of minimum width and refer to this value as $D_0$. Hence, the final expression for the focus-sensitivity "cost-covariance" field (CCF field) becomes:

$$\sum_k P_k((M \otimes U_k^{+d}) \cdot W) \otimes U_k^{+d} - \sum_k P_k((M \otimes U_k^0) \cdot W) \otimes U_k^0 - \quad \text{Eqn. (11)}$$

$$D_0 \sum_k P_k((M \otimes U_k^0) \cdot (W_{ext} - W_{int})) \otimes U_k^0 + c.c.$$

Note that we refer to this expression as a field because it can be used to generate a 2D value map by varying the point P', which is the location where the small change to the mask is added.

Process for Computing the CCF Field

Figure 3:
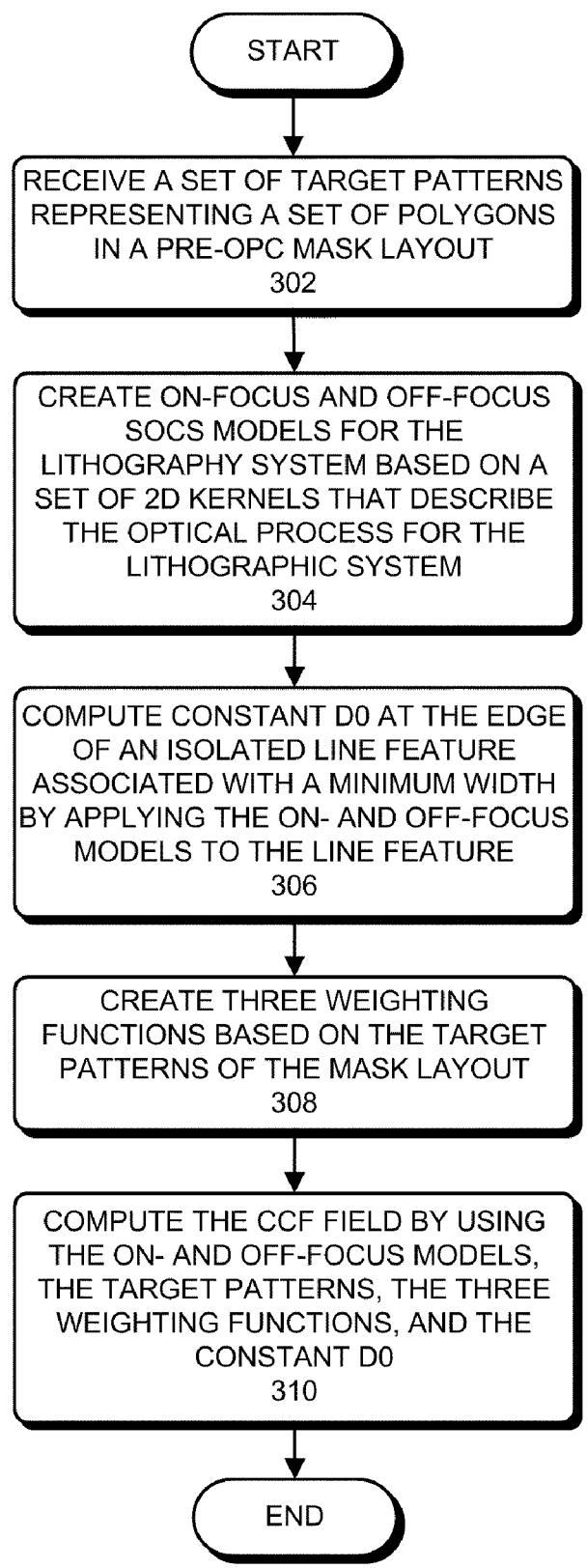
FIG. 3 presents a flowchart illustrating a process for computing the CCF field for a mask layout in accordance with an embodiment of the present invention.

FIG. 3 presents a flowchart illustrating a process for computing the CCF field for a mask layout based on Eqn. (11) in accordance with an embodiment of the present invention.

During the computation operation, the system first receives a set of target patterns which represent a set of polygons in a pre-OPC mask layout (step 302). Note that each target pattern can represent one or more polygon features within the pre-OPC mask layout. The system then creates an on-focus SOCS model and an off-focus SOCS model for the lithography system based on a set of 2D kernels that describes the optical process for the lithographic system (step 304). Note that these models can be generated from calibrated or uncalibrated data and need not include resist processing or other non-optical components.

Next, the system computes quantity $$D_0 = \frac{\partial I/\partial F}{\nabla I \cdot \hat{n}}$$

at the edge of an isolated line feature associated with a minimum width by applying the on- and off-focus models to the line feature (step 306). Note that both $\partial I/\partial F$ and $\nabla I \cdot \hat{n}$ can be computed by using the expressions defined above.

Additionally, the system creates three weighting functions based on the target patterns of the mask layout (step 308). More specifically, the first weighting function, $W_0$, is sharply peaked on the edges of the target patterns; the second weighting function, $W_{ext}$, is sharply peaked at a fixed distance outside the edges of the target patterns; and the third weighting function, $W_{int}$, is peaked at the same fixed distance inside the edges of the target patterns. Note that step 306 and step 308 can be performed in any order.

Finally, the system computes the CCF field based on Eqn. (11) by using the on- and off-focus models, the target patterns, the three weighting functions, and the constant value $D_0$ (step 310). More specifically, computing the CCF field involves individually computing the three terms in Eqn. (11) using the above-mentioned items. In some embodiments of the present invention, the target patterns are used as an approximation to the corresponding mask layout.

As shown in Eqn. (11), to compute the first term, the system iteratively computes a running sum for the set of kernels in the off-focus model. More specifically, for each kernel in the off-focus model, the system performs the steps of: convolving the target patterns with the kernel to obtain a first convolved field; performing a point-by-point (in the 2D space) multiplication of the first convolved field with weighting function $W_0$ to obtain a weighted first convolved field; convolving the weighted first convolved field with the kernel to obtain a second convolved field; if the kernel is odd under inversion, multiplying the second convolved field by −1; and adding the above result to the running sum.

To compute the second term, the system repeats the same steps used for computing the first term, except that the on-focus model is used in place of the off-focus model in this case. Similarly, to compute the third term, the system repeats the same steps used for computing the second term, except that the step of point-to-point multiplication uses $W_{ext}-W_{int}$ instead of $W_0$. Finally, the CCF field is obtained by subtracting the second term from the first term and further subtracting the third term (which is multiplied by $D_0$).

Note that for a given mask layout and a given set of kernels, a corresponding CCF field is uniquely determined, and therefore only needs to be computed once for the given configuration. This property of the CCF field facilitates quickly generating a desirable AF placement, as is described in more detail below.

Generating an AF Placement Based on the CCF Field

Recall that at each location in the CCF field, the value of the CCF field represents how much placing an assist feature at that point affects the overall contour movement (integrated over all edges) of the target patterns due to a change in focus conditions. Consequently, at a given location in the CCF field, a zero value indicates no effect on the overall contour movement due to adding an assist feature at that location; a negative value indicates a reduction of overall contour movement due to adding an assist feature at that location; and a positive value indicates an increase of overall contour movement due to adding an assist feature at that location. Also recall that one of the goals of placing the assist features in the mask layout is to minimize the integrated contour movement due to a focus condition change. Hence, the computed CCF field can be used to facilitate generating an AF placement in the mask layout.

In one embodiment, the system can place assist features at locations in the mask layout wherein the computed CCF field has negative values. These types of assist features are the "positive" assist features. In contrast, the positive values in the CCF field indicate that the amount of contour movement is increased by placing positive assist features at these locations, and therefore placing positive assist features at these locations should be avoided. In one embodiment of the present invention, the system can place "negative" assist features at locations in the mask layout where the computed CCF values have positive values. Note that such negative assist features correspond to holes in the target patterns.

Figure 4:
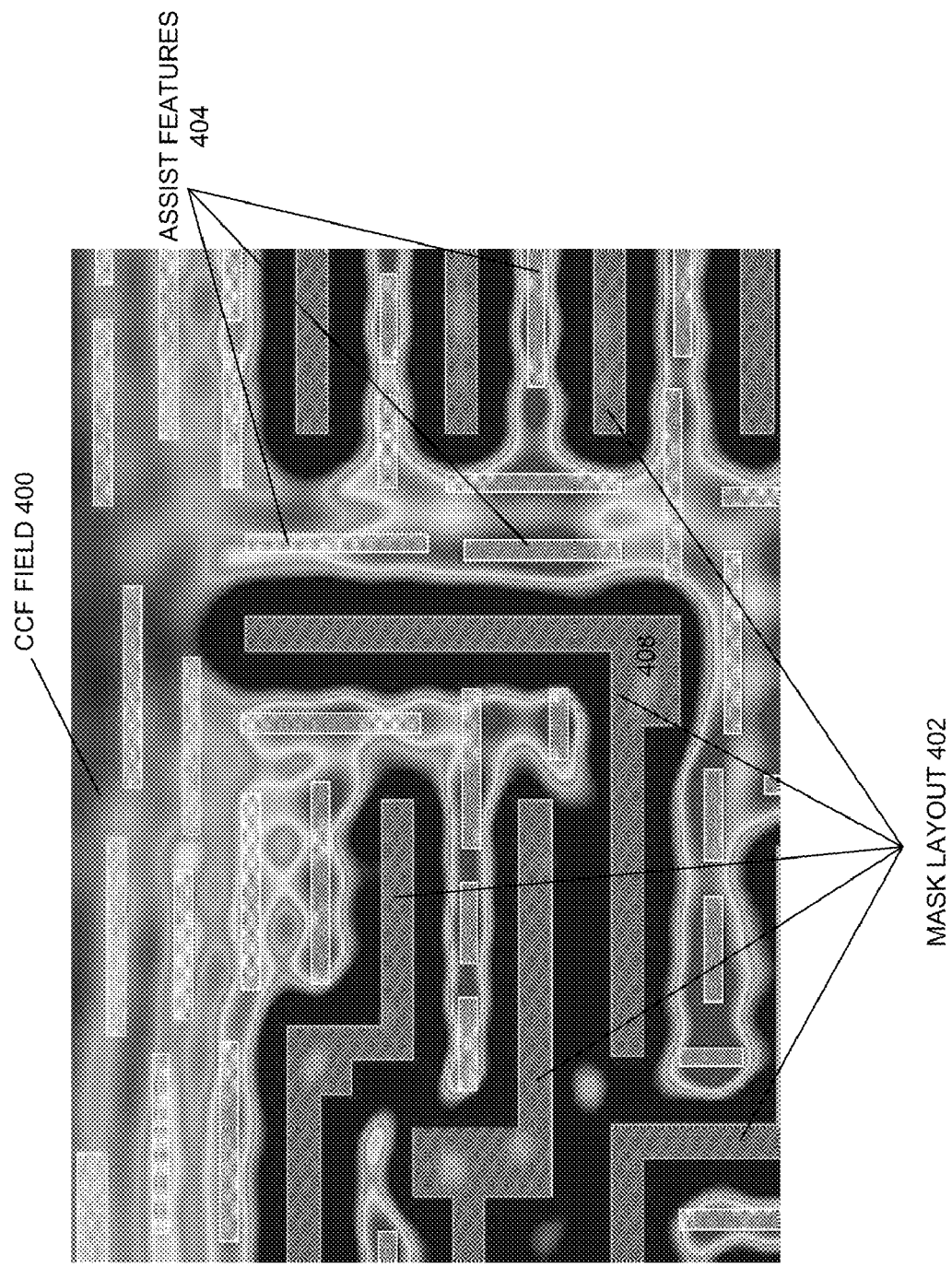
FIG. 4 illustrates an exemplary CCF field, a set of assist features placed according to the CCF field, and an associated target pattern in accordance with an embodiment of the present invention.

FIG. 4 illustrates an exemplary CCF field 400 (represented by a color map), a set of assist features 404 placed according to CCF field 400, and an associated mask layout 402 (the yellow polygons) in accordance with an embodiment of the present invention. Note that mask layout 402 overlap CCF field 400 in FIG. 4 for convenience of illustration, but mask layout 402 are not part of CCF field 400 (which only includes the color map).

More specifically, the blue regions in CCF field 400 represent negative CCF values, and hence indicate desirable locations for placing positive assist features. In contrast, the red regions represent positive values of CCF field 400, and hence indicate desirable locations for placing negative assist features. Furthermore, for each color in the color map which is in between red and blue, if it has negative values, it suggests a good location to place positive assist features. Otherwise, it indicates a good location to place negative assist features. As shown in FIG. 4, the white line features 404 are the positive assist features placed in the regions having the negative CCF values. However, the assist feature placement in FIG. 4 is not intended to be an optimal AF placement. In another embodiment, the assist features can have geometries other than rectangles, and can be placed with higher or lower densities than the AF placement shown in FIG. 4.

In one embodiment of the present invention, during AF placement with reference to the CCF field, assist features are placed in proximity to the polygons within mask layout 402 according to a set of placement rules. In particular, each candidate assist feature is checked for the MRC (Mask Rule Check) violations. If an MRC violation is found, the candidate assist feature is adjusted (e.g., in size and distance) to correct the MRC violation. Hence, each assist feature placement obeys the mask rules.

In one embodiment of the present invention, for each AF placement generated based on the CCF field, the system checks the assist features for their printability. If only the SRAFs are used, the assist features are not allowed to print; hence, this constraint may require the initial placement to be adjusted to satisfy the non-printing rule.

Process for Determining an AF Placement

Figure 5:
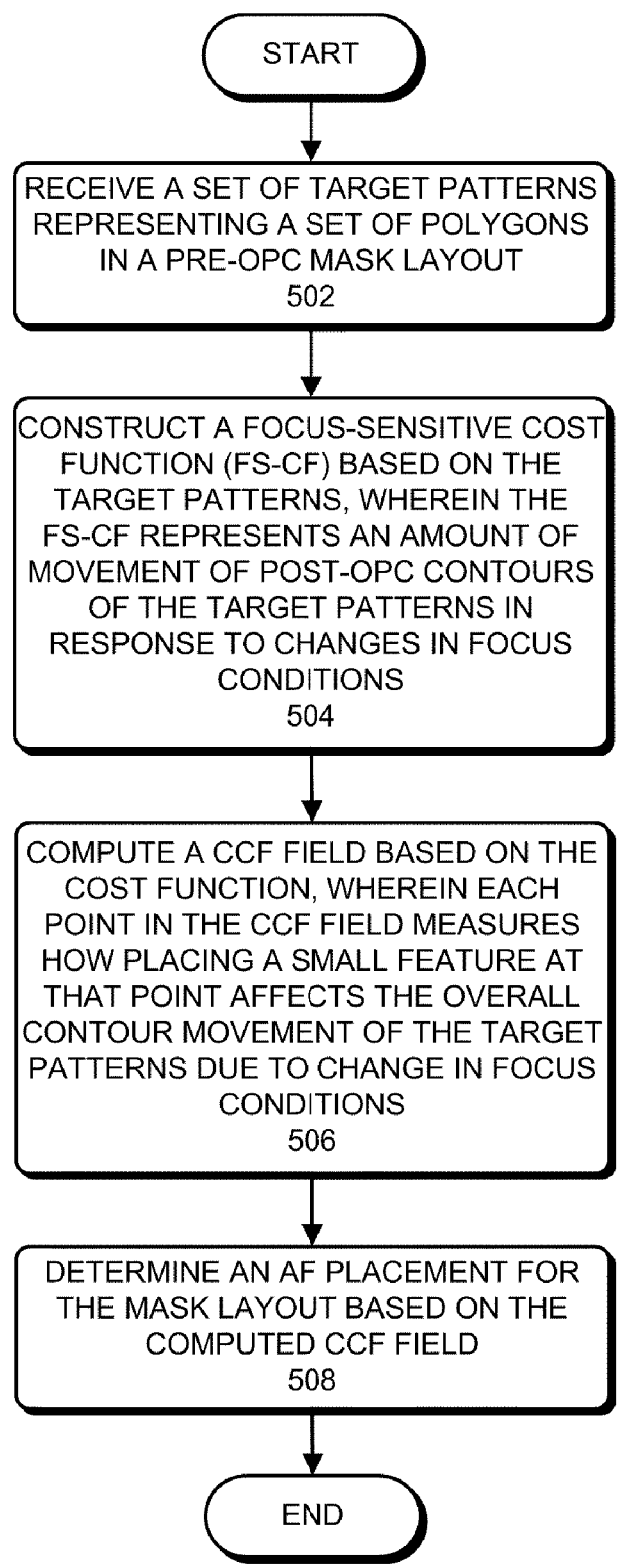
FIG. 5 presents a flowchart illustrating a process for generating an AF placement for a mask layout based on an associated CCF field in accordance with an embodiment of the present invention.

FIG. 5 presents a flowchart illustrating a process for determining an AF placement within a mask layout based on an associated CCF field in accordance with an embodiment of the present invention.

During operation, the system starts by receiving a set of target patterns which represent a set of polygons in a pre-OPC mask layout (step 502).

The system then constructs a focus-sensitive cost function based on the target patterns, wherein the focus-sensitive cost function represents an amount of movement of post-OPC contours of the target patterns in response to changes in focus condition of the lithography system (step 504). Note that the contours (i.e., the edges) of the target patterns substantially coincide with the edges of set of the polygons of the pre-OPC mask layout. In one embodiment of the present invention, the system can construct the cost function based on Eqn. (2). Note that at this step, the system does not have to compute the values for the cost function.

The system next computes a CCF field based on the focus-sensitive cost function, wherein the CCF field is a 2D map, wherein each point in the 2D map measures how placing a small feature at that point affects the overall contour movement (integrated over all edges) of the target patterns due to change in focus conditions (step 508). In one embodiment of the present invention, the CCF field is obtained by differentiating the focus-sensitive cost function with respect to a small change made in the vicinity of the target patterns.

Finally, the system generates an AF placement for the mask layout based on the computed CCF field (step 510). Recall that the objective of placing the assist features is to minimize the contour movement of the target patterns as the focus condition changes. In one embodiment of the present invention, the system places positive assist features at locations in the mask layout wherein the computed CCF values have negative values, and places negative assist features at locations in the mask layout wherein the computed CCF values have positive values.

Process for Evaluating the Quality of an Assist Feature Placement

Figure 6:
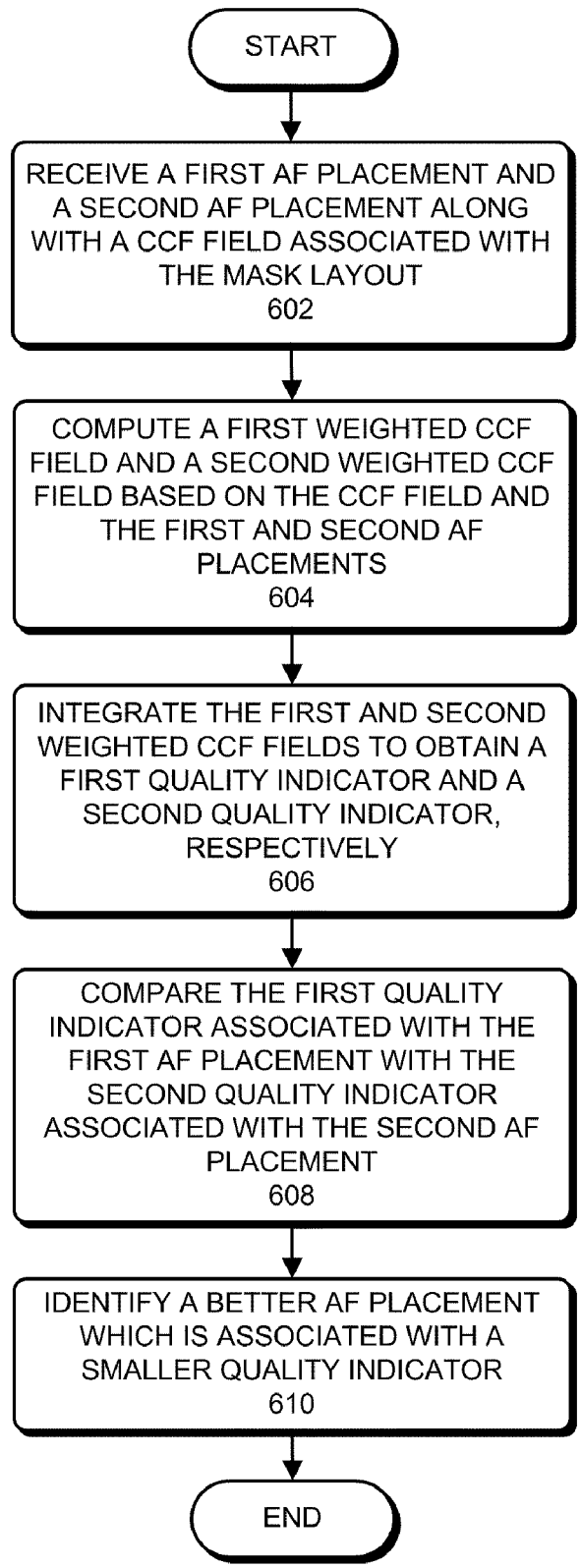
FIG. 6 presents a flowchart illustrating a process for evaluating the quality of one or more AF placements based on the CCF field in accordance with an embodiment of the present invention.

FIG. 6 presents a flowchart illustrating a process for evaluating the quality of one or more AF placements based on the CCF field in accordance with an embodiment of the present invention. (Note that the CCF field can be obtained using the above-described process.)

During operation, the system receives a first AF placement and a second AF placement along with a CCF field associated with the mask layout (step 602). For example, the first AF placement can be obtained from a rule-based AF placement technique, and the second AF placement can be obtained from a model-based AF placement technique.

The system then multiplies the CCF field with a placement map for the first AF placement through a point-to-point multiplication operation to obtain a first weighted CCF field. In some embodiments, the placement map equals one (i.e., having a weight of 1) at locations of positive assist features, minus one (−1) at locations of negative assist features, and zero at locations where there is no assist feature. Similarly, the system computes a second weighted CCF field based on the CCF field and the second AF placement (step 604).

Next, the system separately integrates the first and the second weighted CCF fields to obtain a first and second quality indicator, respectively (step 606). In one embodiment, the system integrates each weighted CCF field by summing all the values within the weighted CCF field to obtain the associated quality indicator.

Next, the system compares the first quality indicator associated with the first AF placement with the second quality indicator associated with the second AF placement (step 608), and identifies a better AF placement which is associated with a smaller quality indicator (step 610).

Conclusion

Embodiments of the present invention provide a technique for determining AF placement for a mask layout based on a focus-sensitive cost-covariance field (FS-CCF) model, which reflects the incremental change in the global through-focus contour movement of specified pattern edges due to the addition of a pattern at each point on the mask layout. Moreover, embodiments of the present invention provide a technique that facilitates evaluating the quality of each candidate AF placement for the same mask layout based on the FS-CCF model.

Note that the FS-CCF model can be directly derived from the drawn patterns, which allows the assist features to be placed on the mask layout prior to the optical proximity correction (OPC) operation on the mask layout. Moreover, an AF placement generated in this manner can accurately predict the optimal AF placement on the mask layout after the OPC operation.

Furthermore, the proposed FS-CCF model neglects interference between assist features. In so doing, the assist-feature-generation process does not require multiple iterations, and thereby improves speed and avoids instability or slow convergence, which tends to be a problem for iterative techniques. Note that AF placements based on an FS-CCF model can quickly and easily adapt to changes in the lithographic system, enabling early development of assist features and applications in source optimization and feedback-loop design rule optimization.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for evaluating the quality of an assist feature placement in a post-optical proximity correction (post-OPC) mask layout, the method comprising:

receiving a set of target patterns which represent a set of polygons in a pre-OPC mask layout;

receiving an assist feature placement for the post-OPC mask layout;

constructing a focus-sensitive cost function based on the target patterns, wherein the focus-sensitive cost function represents an amount of movement of post-OPC contours of the target patterns in response to changes in focus condition of the lithography system, and wherein the contours of the target patterns substantially coincide with the edges of set of the polygons;

determining, by computer, a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout; and using the CCF field to evaluate the quality of the assist feature placement for the post-OPC mask layout.

2. The method of claim 1, wherein using the CCF field to evaluate the quality of the assist feature placement for the post-OPC mask layout includes:

multiplying the CCF field with a placement map for the assist feature placement to obtain a weighted CCF field, wherein the placement map equals one at locations of positive assist features, minus one at locations of negative assist features, and zero at locations where there is no assist feature;

integrating the weighted CCF field to obtain a quality indicator; and evaluating the quality of the assist feature placement based on the quality indicator.

3. The method of claim 2, wherein evaluating the quality of the assist feature placement based on the quality indicator includes:

comparing a first quality indicator associated with a first assist feature placement with a second quality indicator associated with a second assist feature placement; and identifying a better assist feature placement associated with a smaller of the first and second quality indicators.

4. The method of claim 1, wherein constructing the focus-sensitive cost function based on the contour map includes:

defining a contour movement metric $$\frac{\partial I/\partial F}{\nabla I \cdot \hat{n}},$$

wherein $\partial I/\partial F$ represents change in intensity I on the contour map with respect to change in focus F, $\Delta I$ is the gradient of the intensity I, and $\hat{n}$ is a normalized vector perpendicular to the edges of the set of target patterns; and constructing the focus-sensitive cost function $$C = \oint_{edges} \frac{\partial I/\partial F}{\nabla I \cdot \hat{n}}$$

by integrating the contour movement metric over the edges of the set of target patterns.

5. The method of claim 4, wherein computing the CCF field based on the focus-sensitive cost function includes:

differentiating the focus-sensitive cost function with respect to a change made within the post-OPC mask layout to obtain an expression $$\delta C = \oint_{edges} \frac{\delta(\partial I/\partial F)}{\nabla I \cdot \hat{n}} - \frac{\partial I/\partial F}{(\nabla I \cdot \hat{n})^2} \delta \nabla I;$$

for each change made at a location P within the mask layout, evaluating δC using the expression, wherein location P is a candidate location for placing an assist feature; and forming the CCF field based on the δC values computed at all candidate locations for placing assist features.

6. The method of claim 5, wherein computing δC for each location P includes approximating I(P$_0$) using an expression:

$$I(P_0) = \sum_k \left| \int M(P) U_k (P_0 - P) d^2 P \right|^2$$

to compute the intensity I, wherein U$_k$ is a set of 2D kernels in the sum of coherent systems (SOCS) approximation, M is a 2D function that represents the pre-OPC mask layout, and P$_0$ is an evaluation point within the mask layout.

7. The method of claim 6, wherein computing δC for each location P further includes computing the effect of adding a small pattern δM at location P within the post-OPC mask layout on intensity I(P$_0$) at evaluation point P$_0$ using an expression:

$$\delta I(P_0) = \sum_k \left( \int M(P) U_k (P_0 - P) d^2 P \right) \left( \int \delta M(P) U_k (P_0 - P) d^2 P \right) + \sum_k \left( \int \delta M(P) U_k (P_0 - P) d^2 P \right) \left( \int \delta M(P) U_k (P_0 - P) d^2 P \right) + c.c.,$$

wherein the first term represents the interference of δM with the post-OPC mask layout;

wherein the second term represents the interaction between δM and another small pattern placed at a different location P; and wherein location P is at a distance away from the evaluation point P$_0$.

8. The method of claim 7, wherein the post-OPC mask layout is approximated using the pre-OPC mask layout.

9. A non-transitory computer-readable storage medium storing instructions, that when executed by a computer, cause the computer to perform a method for evaluating the quality of an assist feature placement in a post-optical proximity correction (post-OPC) mask layout, the method comprising:

receiving a set of target patterns which represent a set of polygons in a pre-OPC mask layout;

receiving an assist feature placement for the post-OPC mask layout;

constructing a focus-sensitive cost function based on the target patterns, wherein the focus-sensitive cost function represents an amount of movement of post-OPC contours of the target patterns in response to changes in focus condition of the lithography system, and wherein the contours of the target patterns substantially coincide with the edges of set of the polygons;

determining a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout; and using the CCF field to evaluate the quality of the assist feature placement for the post-OPC mask layout.

10. The non-transitory computer-readable storage medium of claim 9, wherein using the CCF field to evaluate the quality of the assist feature placement for the post-OPC mask layout includes:

multiplying the CCF field with a placement map for the assist feature placement to obtain a weighted CCF field, wherein the placement map equals one at locations of positive assist features, minus one at locations of negative assist features, and zero at locations where there is no assist feature;

integrating the weighted CCF field to obtain a quality indicator; and evaluating the quality of the assist feature placement based on the quality indicator.

11. The non-transitory computer-readable storage medium of claim 10, wherein evaluating the quality of the assist feature placement based on the quality indicator includes:

comparing a first quality indicator associated with a first assist feature placement with a second quality indicator associated with a second assist feature placement; and identifying a better assist feature placement associated with a smaller of the first and second quality indicators.

12. The non-transitory computer-readable storage medium of claim 9, wherein constructing the focus-sensitive cost function based on the contour map includes:

defining a contour movement metric $$\frac{\partial I/\partial F}{\nabla I \cdot \hat{n}},$$

wherein ∂I/∂F represents change in intensity I on the contour map with respect to change in focus F, ΔI is the gradient of the intensity I, and $\hat{n}$ is a normalized vector perpendicular to the edges of the set of target patterns; and constructing the focus-sensitive cost function $$C = \oint_{edges} \frac{\partial I/\partial F}{\nabla I \cdot \hat{n}}$$

by integrating the contour movement metric over the edges of the set of target patterns.

13. The non-transitory computer-readable storage medium of claim 12, wherein computing the CCF field based on the focus-sensitive cost function includes:

differentiating the focus-sensitive cost function with respect to a change made within the post-OPC mask layout to obtain an expression $$\delta C = \oint_{edges} \frac{\delta(\partial I/\partial F)}{\nabla I \cdot \hat{n}} - \frac{\partial I/\partial F}{(\nabla I \cdot \hat{n})^2} \delta \nabla I;$$

for each change made at a location P within the mask layout, evaluating δC using the expression, wherein location P is a candidate location for placing an assist feature; and forming the CCF field based on the δC values computed at all candidate locations for placing assist features.

14. The non-transitory computer-readable storage medium of claim 13, wherein computing δC for each location P includes approximating I(P₀) using an expression:

$$I(P_0) = \sum_k \left| \int M(P) U_k(P_0 - P) d^2 P \right|^2$$

to compute the intensity I, wherein $U_k$ is a set of 2D kernels in the sum of coherent systems (SOCS) approximation, M is a 2D function that represents the pre-OPC mask layout, and $P_0$ is an evaluation point within the mask layout.

15. The non-transitory computer-readable storage medium of claim 14, wherein computing δC for each location P further includes computing the effect of adding a small pattern δM at location P within the post-OPC mask layout on intensity $I(P_0)$ at evaluation point $P_0$ using an expression:

$$\delta I(P_0) = \sum_k \left( \int M(P) U_k(P_0 - P) d^2 P \right) \left( \int \delta M(P) U_k(P_0 - P) d^2 P \right) + \sum_k \left( \int \delta M(P) U_k(P_0 - P) d^2 P \right) \left( \int \delta M(P) U_k(P_0 - P) d^2 P \right) + c.c.,$$

wherein the first term represents the interference of δM with the post-OPC mask layout;

wherein the second term represents the interaction between δM and another small pattern placed at a different location P; and wherein location P is at a distance away from the evaluation point $P_0$.

16. The non-transitory computer-readable storage medium of claim 15, wherein the post-OPC mask layout is approximated using the pre-OPC mask layout.

17. A system for evaluating the quality of an assist feature placement in a post-optical proximity correction (post-OPC) mask layout, the system comprising:
  a processor; and
  a computer-readable storage medium storing instructions that are capable of being executed by the processor, the instructions comprising:
    instructions to receive a set of target patterns which represent a set of polygons in a pre-OPC mask layout;
    instructions to receive an assist feature placement for the post-OPC mask layout;
    instructions to construct a focus-sensitive cost function based on the target patterns, wherein the focus-sensitive cost function represents an amount of movement of post-OPC contours of the target patterns in response to changes in focus condition of the lithography system, and wherein the contours of the target patterns substantially coincide with the edges of set of the polygons;
  instructions to determine a cost-covariance field (CCF field) based on the focus-sensitive cost function, wherein the CCF field is a two-dimensional (2D) map representing changes to the focus-sensitive cost function due to an addition of a pattern at a given location within the post-OPC mask layout; and
  instructions to use the CCF field to evaluate the quality of the assist feature placement for the post-OPC mask layout.

18. The system of claim 17, wherein the instructions to use the CCF field to evaluate the quality of the assist feature placement for the post-OPC mask layout include:
  instructions to multiply the CCF field with a placement map for the assist feature placement to obtain a weighted CCF field, wherein the placement map equals one at locations of positive assist features, minus one at locations of negative assist features, and zero at locations where there is no assist feature;
  instructions to integrate the weighted CCF field to obtain a quality indicator; and
  instructions to evaluate the quality of the assist feature placement based on the quality indicator.

19. The system of claim 18, wherein the instructions to evaluate the quality of the assist feature placement based on the quality indicator include:
  instructions to compare a first quality indicator associated with a first assist feature placement with a second quality indicator associated with a second assist feature placement; and
  instructions to identify a better assist feature placement associated with a smaller of the first and second quality indicators.

* * * * *